(12) United States Patent
Sakurai et al.

(10) Patent No.: US 11,184,978 B2
(45) Date of Patent: Nov. 23, 2021

(54) ELECTRIC DEVICE

(71) Applicant: THE FOUNDATION FOR THE PROMOTION OF INDUSTRIAL SCIENCE, Tokyo (JP)

(72) Inventors: Takayasu Sakurai, Tokyo (JP); Makoto Takamiya, Tokyo (JP); Tokihiko Mori, Tokyo (JP)

(73) Assignee: THE FOUNDATION FOR THE PROMOTION OF INDUSTRIAL SCIENCE, Tokyo (JP)

( * ) Notice: Subject to any disclaimer, the term of this patent is extended or adjusted under 35 U.S.C. 154(b) by 0 days.

(21) Appl. No.: 16/486,215

(22) PCT Filed: Feb. 12, 2019

(86) PCT No.: PCT/JP2019/004808
§ 371 (c)(1),
(2) Date: Aug. 15, 2019

(87) PCT Pub. No.: WO2019/244393
PCT Pub. Date: Dec. 26, 2019

(65) Prior Publication Data
US 2021/0337668 A1    Oct. 28, 2021

(30) Foreign Application Priority Data

Jun. 19, 2018 (JP) ............................. JP2018-116019

(51) Int. Cl.
*H01R 12/52* (2011.01)
*H01R 12/73* (2011.01)
(Continued)

(52) U.S. Cl.
CPC ............. *H05K 1/144* (2013.01); *H05K 1/117* (2013.01); *H05K 2201/042* (2013.01); *H05K 2201/09409* (2013.01)

(58) Field of Classification Search
CPC ........ H05K 1/117; H05K 1/141; H05K 1/144; H05K 3/325; H05K 3/368; H05K 3/3447;
(Continued)

(56) References Cited

U.S. PATENT DOCUMENTS 4,555,151 A * 11/1985 Neese .................... H01R 12/52
439/82
5,070,529 A * 12/1991 Beaufort .............. H01R 12/716
361/798
(Continued)

FOREIGN PATENT DOCUMENTS

EP     0393877 A2    10/1990
JP     63_055871 A    3/1988
(Continued)

*Primary Examiner* — Xiaoliang Chen
(74) *Attorney, Agent, or Firm* — Bacon & Thomas, PLLC

(57) ABSTRACT

An object to provide an electric device easy to manufacture, extensible and of high quality. The electric device comprises a plurality of module boards 51, the module boards 51 piled up on one another, each of the module boards 51 provided with an electrode 53 on its surface, the electrodes 53 on the piled-up module boards 51 generally positioned along a vertical straight line; and a connector 11 connecting the module boards 51, the connector 11 including a body portion 21, the body portion 21 electrically connecting the electrodes 53 positioned along the vertical straight line, and a holder 12 holding the body portion 21, the holder 12 including a board engagement portion and a holder connecting portion, the board engagement portion engaging with the module board 51 so that the connector 11 is mounted on the module board 51, and the holder connecting portion engaging with another holder connecting portion so that the connector 11 is coupled to another vertically adjacent connector 11.

13 Claims, 19 Drawing Sheets

(51) Int. Cl.
*H05K 1/14* (2006.01)
*H05K 1/11* (2006.01)

(58) Field of Classification Search
CPC .......... H05K 2201/10189; H05K 2201/10378; H05K 2201/10386; H05K 2201/10409; H05K 2201/10999; H01R 12/52; H01R 12/73; H01R 12/613; H01R 12/716; H01R 12/7082
USPC ...... 361/735, 752, 798, 807; 439/61, 74, 77, 439/78, 82, 160, 834; 174/541
See application file for complete search history.

(56) References Cited

U.S. PATENT DOCUMENTS

| | | | | |
|---|---|---|---|---|
| 2006/0280410 | A1* | 12/2006 | Fujiwara | G02B 6/4292 385/88 |
| 2011/0188224 | A1* | 8/2011 | Sugai | H05K 7/02 361/807 |
| 2011/0269321 | A1* | 11/2011 | Mizoguchi | H01R 12/613 439/77 |
| 2012/0026702 | A1* | 2/2012 | Sugai | H05K 3/325 361/752 |
| 2015/0194751 | A1* | 7/2015 | Herring | H01R 12/716 439/78 |

FOREIGN PATENT DOCUMENTS

| | | |
|---|---|---|
| JP | 63-072083 A | 4/1988 |
| JP | 3-094492 A | 4/1991 |
| JP | 7-302633 A | 11/1994 |

* cited by examiner (a)

(b)

(a)

(b)

(a)

(b)

(a)

(b)

ELECTRIC DEVICE

TECHNICAL FIELD

The present disclosure generally relates to an electric device.

BACKGROUND ART

Hitherto, in Production sites, such as a factory or others, various data, such as temperature, humidity, vibration or images therein, are collected and analyzed in order to raise productivity. Since the kinds of data to be collected are different for each production site or each post even in the same site, it is common, from viewpoints of cost and others, to use not an electric device with a board mounting all the various modules acquiring various data, such as temperature, humidity, vibration or images, but an electric device with a combination of module boards, each of which mounts just one module. And a technology for connecting two or more module boards by connectors in such an electric device has already been proposed (see, PTL 1).

FIG. 2 is three planar views of an electric device according to the prior art; and FIG. 3 is an exploded view of an electric device according to the prior art. In FIG. 2, (a) is a top plan view, (b) is a side view, and (c) is a bottom view.

Referring to Drawings, an electric device according to the prior art, generally designated by reference numeral 101, comprises three sheets of module board 151, two connectors 111, and a pair of bolt. 171 and nut 172, as fastening members, fastening the module boards 151 and the connectors 111, One of non-illustrated various modules for acquiring various data, such as temperature, humidity, vibration, or images, is mounted on each module board 151.

A plurality of electrodes 153 are formed in a row and in a way of exposure on the front and the back sides of each module board 151 and are electrically connected to a non-illustrated circuit. The connecters 111 are for electrically connecting the electrodes 153 of the adjacent module boards 151 each other, and comprise a holder 112, which is made from insulating material such as synthetic resin and has a generally rectangular plane shape, and a body portion 121, which is elastic and held by the bolder 112. A hole 113 for inserting a bolt 171 therethrough is formed in the holder 112, and a hole 152 for inserting the bolt 171 therethrough is formed in the module board 151. The module board 151 and the holder 112 are fastened by the bolt 171 and the nut 172 in the electric device 101, so that the electrodes 153 of the adjacent module boards 151 are electrically connected with each other. Thereby, the up-down module boards 151 are electrically and mechanically connected with each other.

CITATION LIST

Patent Literature

PTL 1: International patent application PCT/JP2017/2235

SUMMARY OF INVENTION

Technical Problem

However, the work assembling the conventional electric device becomes difficult and needs special jigs when the number of the module boards 151 increases, since it is assembled by putting the connector 111 including the elastic body portion 121 between the module boards 151. That is, there is a problem in manufacturability.

The data of temperature or humidity can be processed even if a low speed processor ire used, though a high speed processor is needed in order to process the data of vibration or images. The high speed processor has many signal terminals since it has various functions, and it cannot be mounted on the module board 151 since the number of electrodes between module boards 151 is limited in the electric device according to the prior art. That is, there is a problem in extendibility.

Although credibility is very important for an apparatus used in a factory etc. for collecting data, accurate measurement becomes impossible in the electric device according to the prior art, since its elastic body portion 121 repeats expansion and contraction with environmental variation, such as temperature variation, and resistance between the module boards 151 increases gradually. That is, there is a problem in quality.

An object of the present disclosure is to solve the above-described problems in the conventional technology and to provide an electric device easy to manufacture, extensible, and of high quality.

Solution to Problem

Accordingly the present disclosure provides an electric device comprising: a plurality of module boards, the module boards piled up on one another, each of the module boards provided with an electrode on its surface, the electrodes on the piled-up module boards generally positioned along a vertical straight line; and a connector connecting the module boards, the connector including a body portion, the body portion electrically connecting the electrodes positioned along the vertical straight line, and a holder holding the body portion, the holder including a board engagement portion and a holder connecting portion, the board engagement portion engaging with the module board so that the connector is mounted on the module board, and the holder connecting portion engaging with another holder connecting portion so that the connector is coupled to another vertically adjacent connector.

In another electric device, a plurality of the connectors are mounted on one module board and each of the connectors is coupled to each of the connectors mounted on another vertically adjacent module board.

In yet another electric device, the module board mounting a plurality of the connectors lies above or beneath the module board mounting a singularity of the connector so that the singular connector is coupled to one of the plural connectors.

In yet another electric device, the electric device further comprises a dummy board mounting the connector; the dummy board is disposed at the same vertical position as the module board mounting the singular connector, and the connector mounted on the dummy board is coupled to the remaining connector of the plural connectors.

In yet another electric device, the body portion includes an electrical connection layer made from elastomer, the electrical connection layer includes a plurality of vertically extending electric conductor members arranged in parallel, the holder includes a holding receiving opening receiving the body portion, a projection formed on an inside surface of the holding receiving opening for pressing the body portion, and a groove formed on an inside surface of the holding receiving opening for releasing expansion, and top and bottom ends of the electric conductor members contact the electrodes.

In yet another electric device, a resist opening, from which resist is removed, is formed on the surface of the module board, and the resist opening includes a whole surface of the body portion abutting against to the surface of the module board.

Effect of Invention

According to the present disclosure, it is possible to provide an electric device which is easy to manufacture, extensible and of high quality.

DESCRIPTION OF EMBODIMENTS

An embodiment will now be described in detail.

Figure 1:
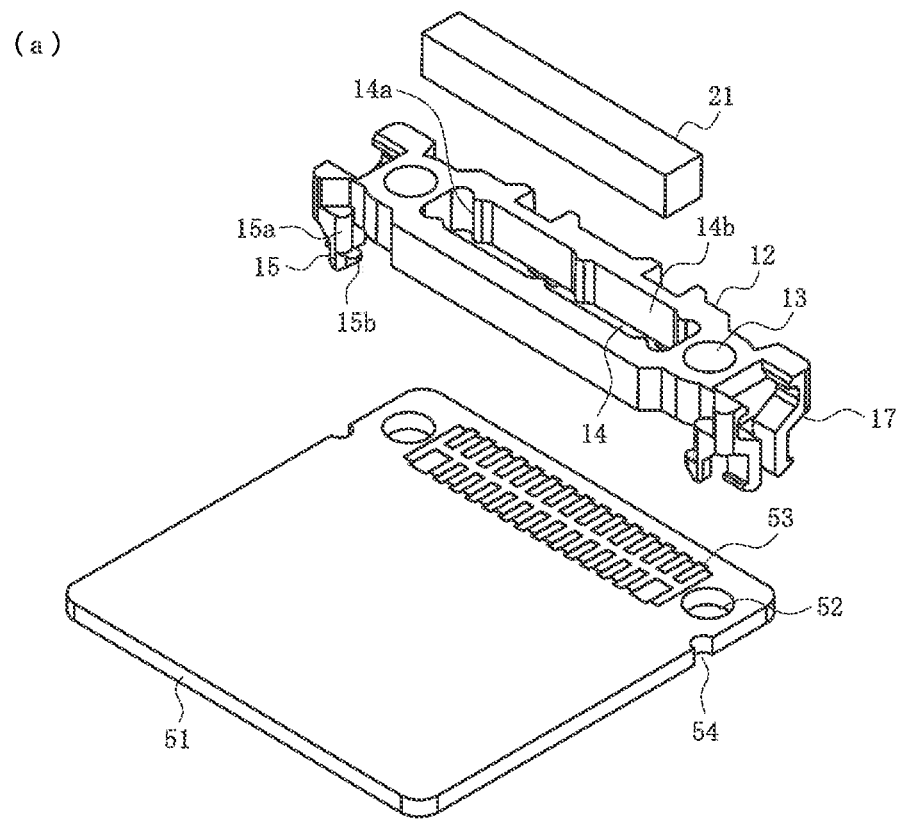
FIG. 1 is a first view showing a combination of a module board and a connector of an electric device according to a first embodiment.
Figure 1:
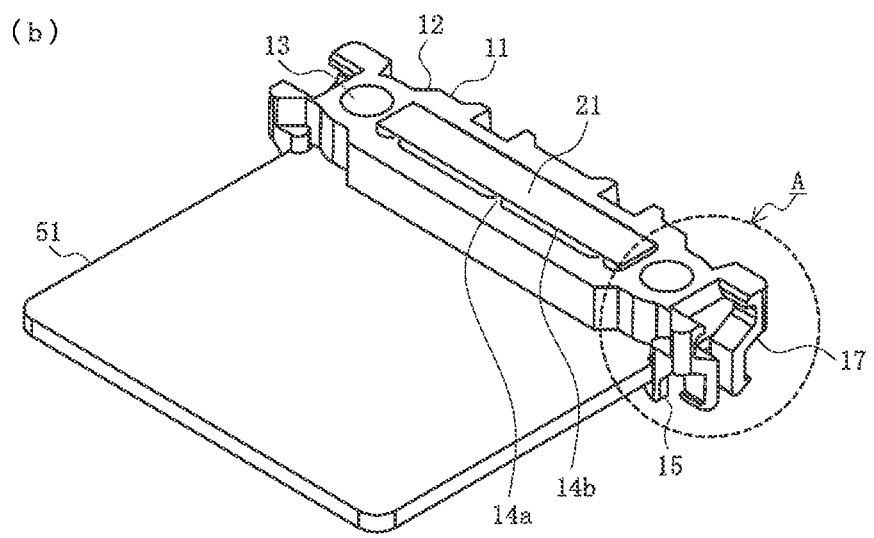
Figure 2:
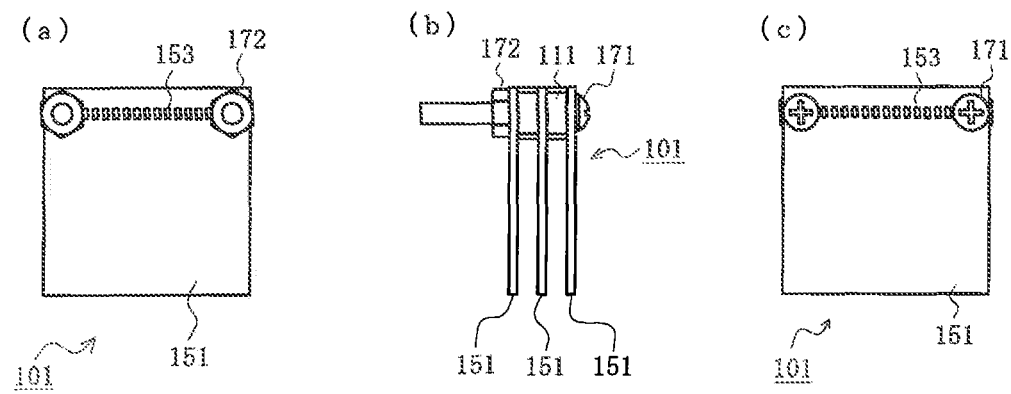
FIG. 2 is three planar views of an electric device according to the prior art.
Figure 3:
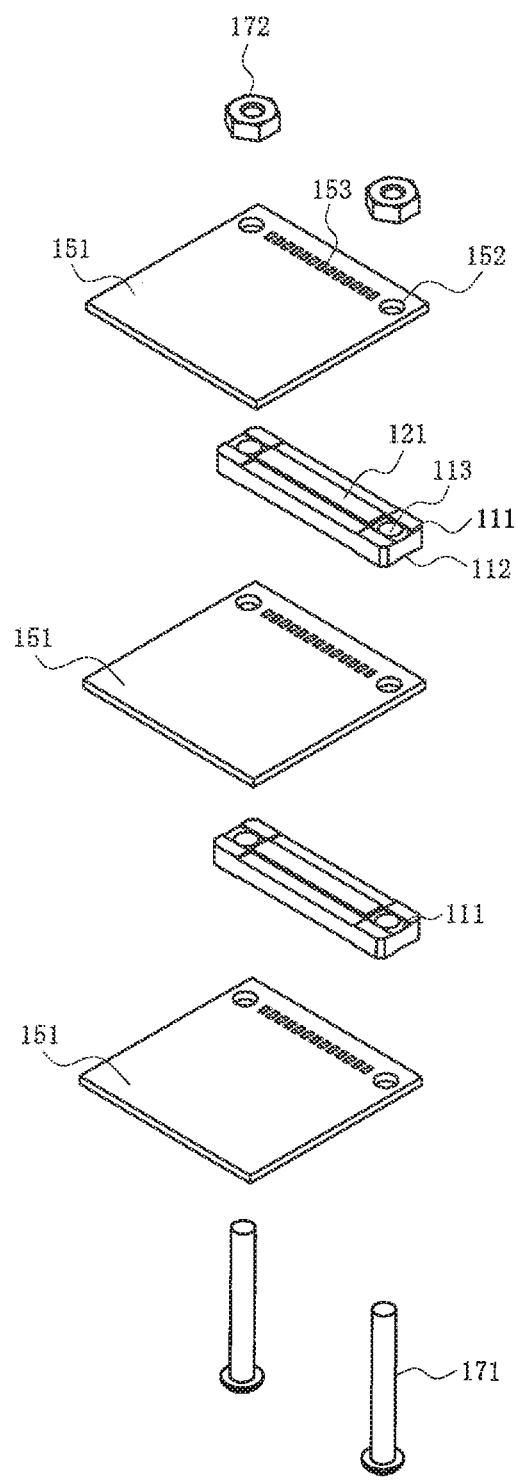
FIG. 3 is an exploded view of the electric device according to the prior art.
Figure 4:
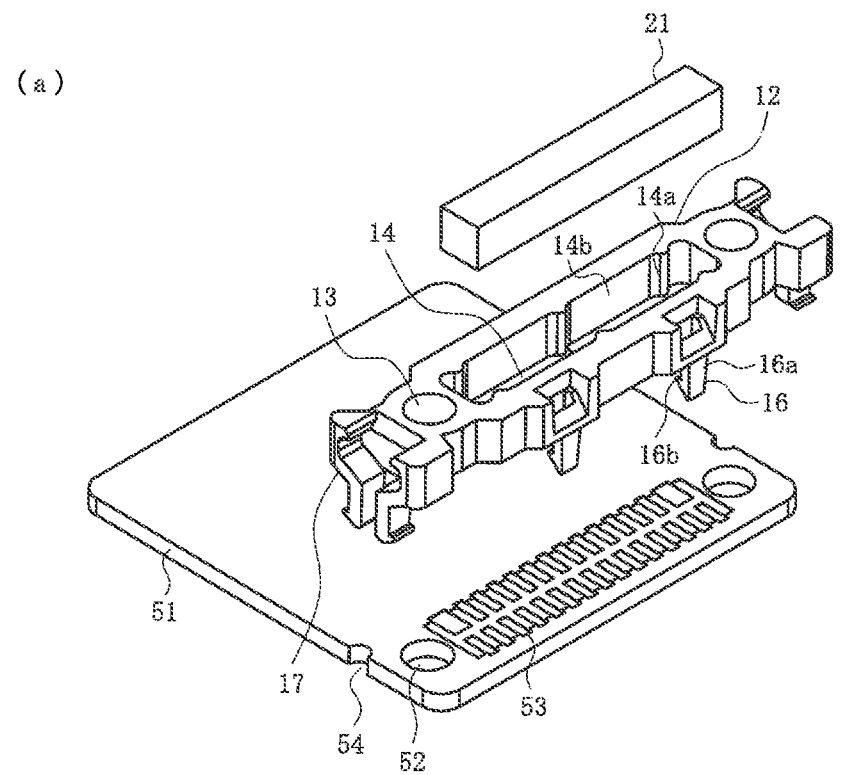
FIG. 4 is a second view showing the combination of the module board and the connector of the electric device according to the first embodiment.
Figure 4:
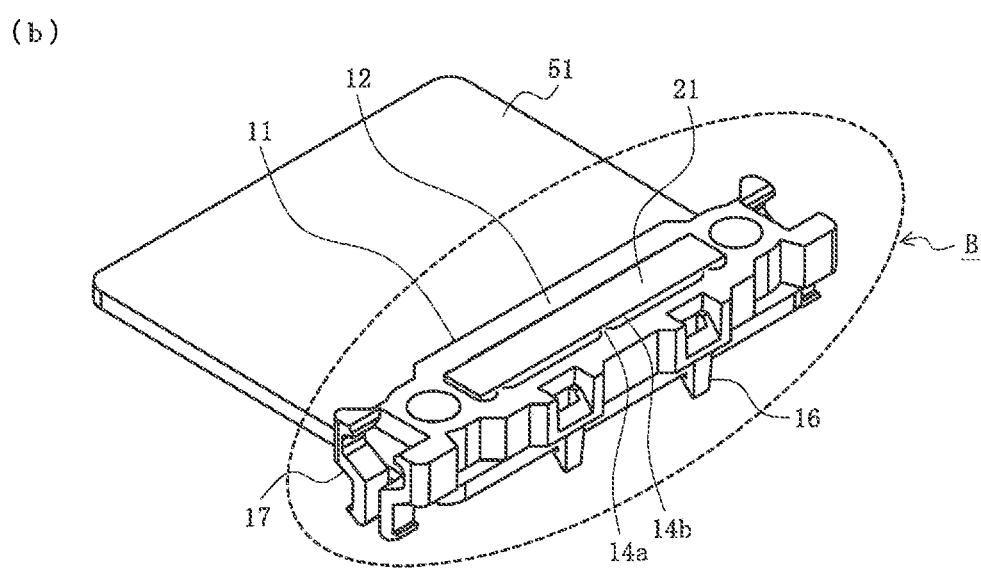
Figure 5:
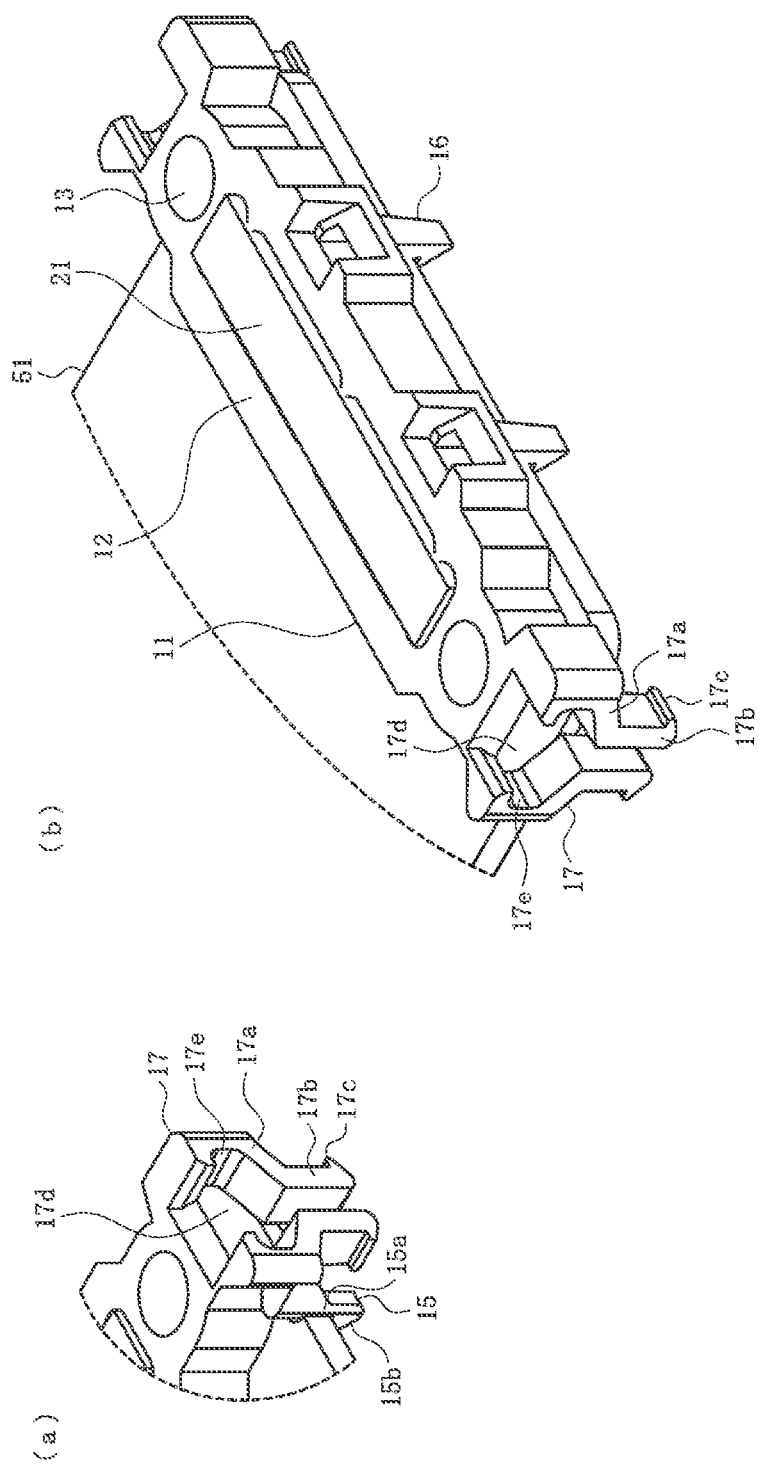
FIG. 5 is an enlarged view of a main portion of the combination of the module board and the connector of the electric device according to the first embodiment.
Figure 6:
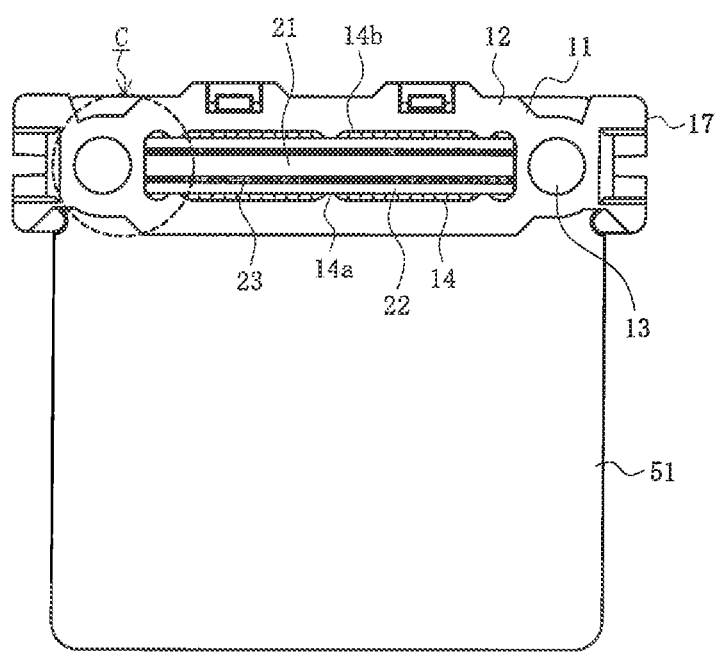
FIG. 6 is a top plan view showing the combination of the module board and the connector of the electric device according to the first embodiment.
Figure 6:
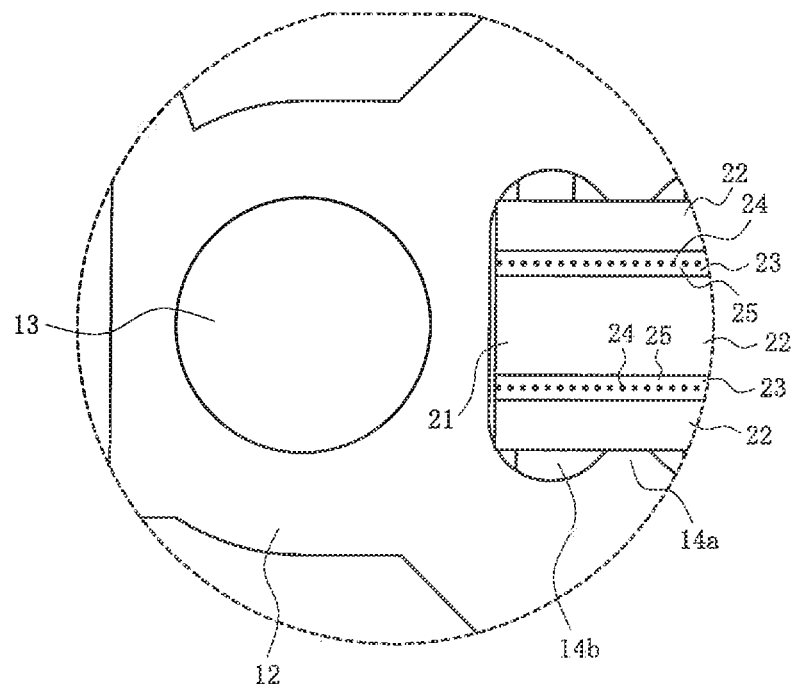
Figure 7:
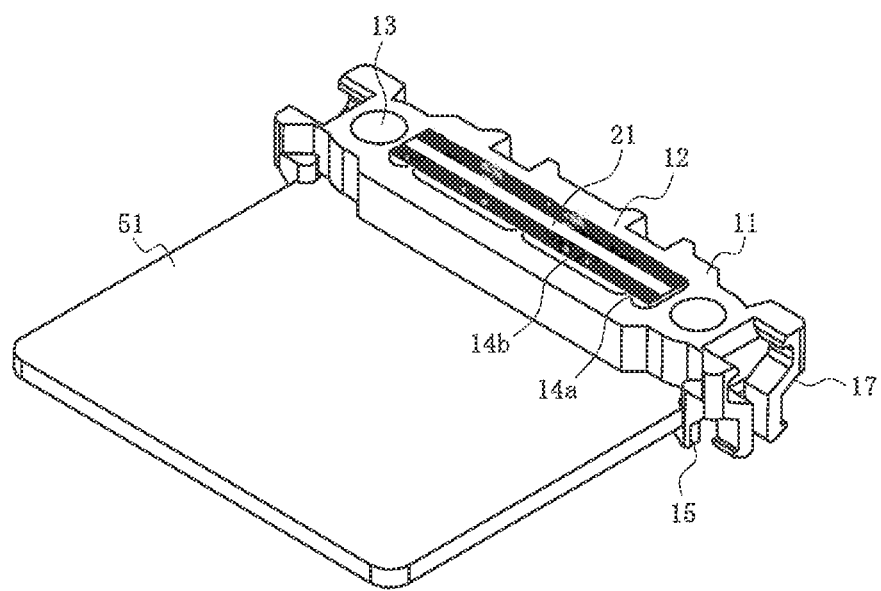
FIG. 7 is a perspective view showing the combination of the module board and the connector of the electric device according to the first embodiment.
Figure 8:
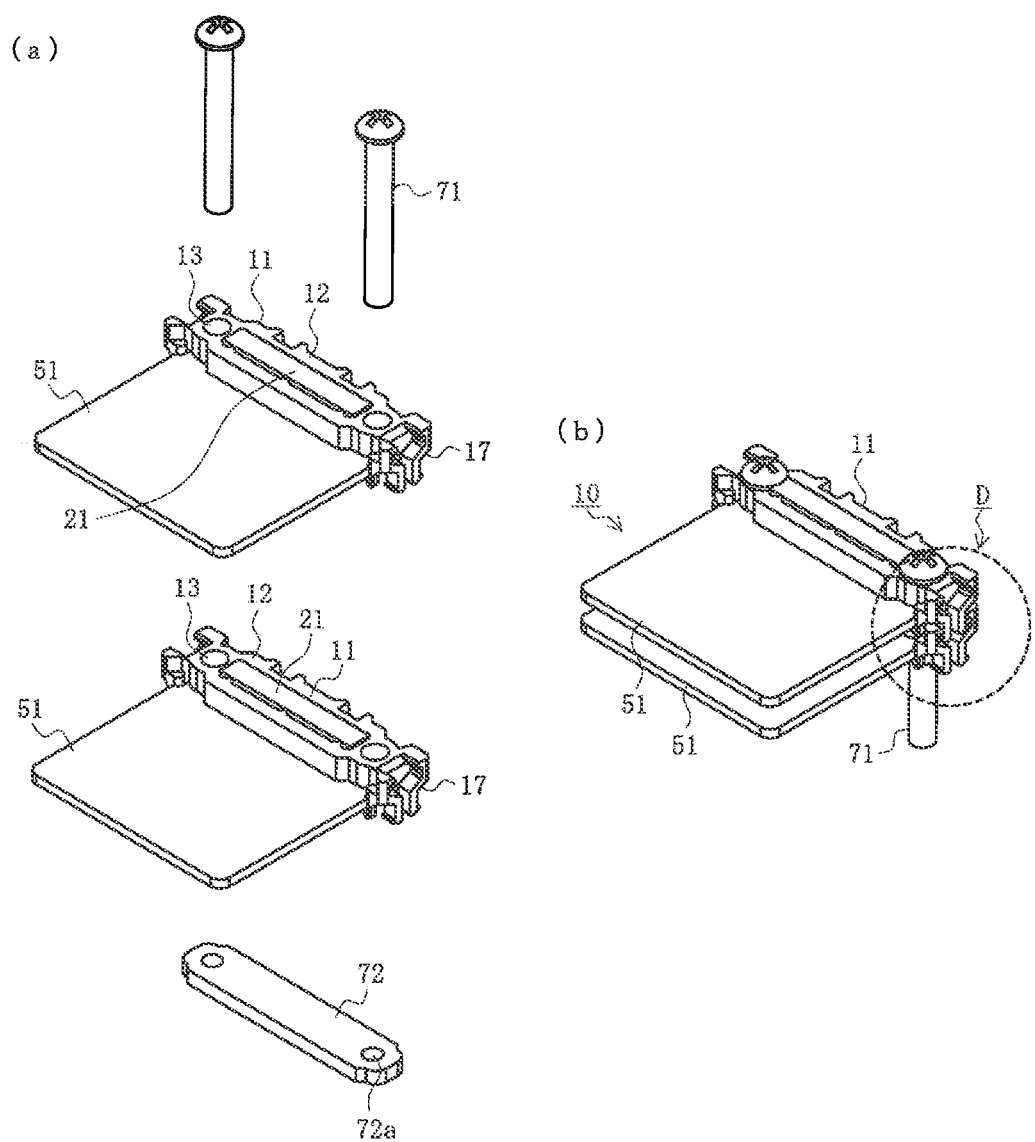
FIG. 8 is a view showing the electric device according to the first embodiment.
Figure 9:
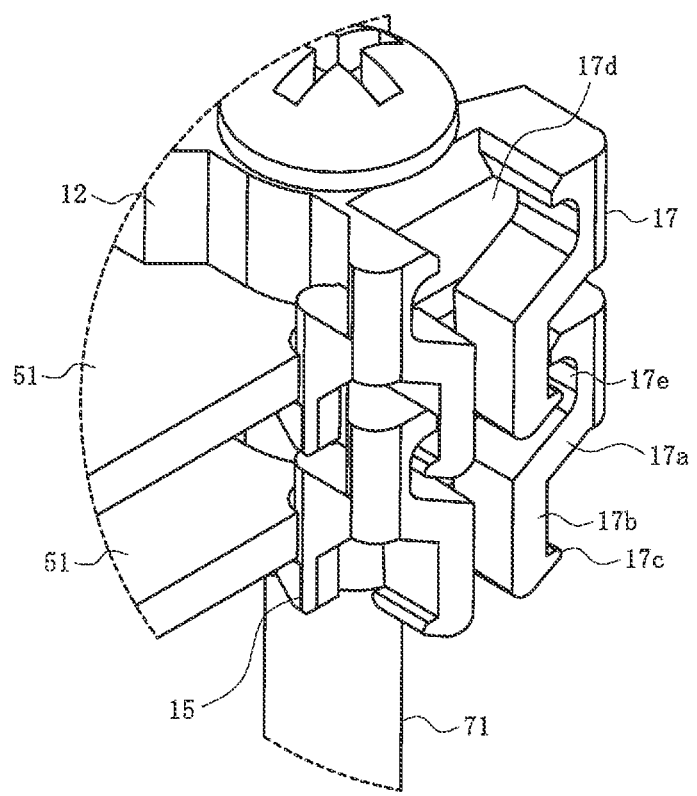
FIG. 9 is an enlarged view of a main portion ("D" portion in FIG. 8(*b*)) of the electric device according to the first embodiment.

FIG. 1 is a first view showing a combination of a module board and a connector of an electric device according to a first embodiment; FIG. 4 is a second view showing the combination of the module board and the connector of the electric device according to the first embodiment; FIG. 5 is an enlarged view of a main portion of the combination of the module board and the connector of the electric device according to the first embodiment; FIG. 6 is a top plan view showing the combination of the module board and the connector of the electric device according to the first embodiment FIG. 7 is a perspective view showing the combination of the module board and the connector of the electric device according to the first embodiment; FIG. 8 is a view showing the electric device according to the first embodiment; and FIG. 9 is an enlarged view of a main portion ("D" portion in FIG. 8(*b*)) of the electric device according to the first embodiment. In FIGS. 1 and 4, (a) is an exploded view and (b) is a perspective view. In FIG. 5, (a) is an enlarged view of "A" portion of FIGS. 1(*b*), and (*b*) is an enlarged view of "B" portion of FIG. 4(*b*) in FIG. 6, (a) is a general view and (b) is an enlarged view of "C" portion of (a). In FIG. 8, (a) is a partial exploded view and (b) is a perspective view.

In Figs., a reference numeral 10 designates an electric device according to the present embodiment. Although the electric device 10 may be used for any kind of use and also may be any kind of electric or electronic device, hereafter, for the sake of explanation, it will be explained as a device that is installed in production sites, such as a factory, or other places, for acquiring various data, such as temperature, humidity, vibration, or images in the place concerned.

It should be noted that, in the present embodiment, expressions of directions such as up, down, left, right, front, rear, and the like, used for explaining the structure and movement of each part of the electric device 10, and the like, are not absolute but relative, and that they are appropriate when each part of the electric device 10, and the like, is in the position shown in the figures, though they should be interpreted according to the varied position if it varies.

According to an example illustrated in Figs., the electric device 10 comprises a pair of module boards 51, a pair of connectors 11, and a pair of bolts 71 and a nut plate 72 for fastening the module board 51 and connector 11 as fastening members. The number of the module board 51 and the connector 11 should not be limited to this example but may be any number.

The module board 51 is a board in a generally rectangular plane-like shape, such as a printed circuit board, where a non-illustrated circuit of electrically conductive line is formed on the surface or in the inside of a plate-like board made from an insulating material such as synthetic resin. Each module board 51 mounts each kind of non-illustrated various modules for acquiring various data, such as temperature, humidity, vibration, or images.

Each of the module boards 51 includes a plurality of electrodes 53 arranged in a row or rows (two rows in the example illustrated in Figs) along its rear side edge (the side edge of upper right side in FIG. 1(*a*)). Each of the electrodes 53 is formed so as to expose on surfaces of either side of each module board 51 and electrically connected with a non-illustrated circuit. The positions of the electrode 53 on the surfaces of both side of the module board 51 are the same. The electrodes 53 opposing each other on both sides of each module board 51 are electrically mutually connected by a non-illustrated conductive via hole or through hole extending in a thickness direction of the module board 51, Plan view arrangements of the electrodes 53 are the same on all of the module boards 51.

Each module board 51 includes a pair of fastening member insertion holes 52, as a pair of position alignment holes, formed outsides of both-ends of the row of the electrodes 53. Engagement recess 54 for engaging with the connector 11 are formed in positions close to the fastening member insertion holes 52 on the right and left side edges of the module board 51. Each of the fastening member insertion holes 52 is a penetration hole penetrating the module board 51 in its thickness direction, and the bolt 71, as a fastening member, is inserted therein, Plan view arrangements of the fastening member insertion holes 52 are the same on all of the module board 51. The arrangement of screw holes 72a formed in the nut plate 72, as a fastening member, is also the same as that of the fastening member insertion holes 52. Therefore, in the electric device 10, plan view arrangements of the electrodes 53 on all the module boards 51 fastened by the bolts 71 and the nut plate 72 are generally identical, so that each of the corresponding electrodes 53 on all the module boards 51 generally lies along a straight line.

The connector 11 according to the present embodiment is configured to electrically connect the corresponding electrodes 53 on the adjacent module boards 51 and is a generally rectangular parallelepiped member, which has a long and narrow rectangular plane shape extending in a direction of the row of the electrodes 53, Each connector 11 comprises a holder 12, which is made from insulating material such as synthetic resin and has a generally rectangular plane shape, and a body portion 21 held by the holder 12.

The body portion 21 has the same configuration as a zebra type connector, a so-called lamination connector, or others, and comprises a pair of a plate-like electrical connection layers 23, in which a plurality of long and thin electric conductor members 24 extending in a vertical direction, i.e., in the thickness direction of the holder 12 (in FIG. 6, the direction perpendicular to the plan) are arranged in parallel, as shown in FIG. 6, and plate-like insulating protection layers 22, which are laminated on the both sides of each electrical connection layer 23 to sandwich it. The electrical connection layers 23 and the insulating protection layers 22 are respectively plate-like members, each of which has a long and narrow rectangular plane shape, are laminated in their thickness direction in such a posture that their thickness direction is the same as the width direction (in FIG. 6, the vertical direction) of the holder 12.

The electrical connection layer 23 comprises an insulator 25 made from elastic elastomer such as silicone sponge rubber, and the electric conductor members 24, each of which has a shape of round bar and is made from a conductive metal, such as a copper alloy. A plurality of electric conductor members 24 are arranged in parallel at predetermined intervals and embedded in the insulator 25. The insulating protection layers 22 are made from relatively hard elastomer, such as silicone solid rubber.

The holder 12 includes a holding receiving opening 14, which has a long and narrow rectangular plane shape and is formed in its center, and a pair of fastening member insertion holes 13, as a pair of position alignment holes, which are formed outsides of both longitudinal ends of the holding receiving opening 14. The holding receiving opening 14 is a penetration hole penetrating the holder 12 in its thickness direction, and the body portion 21, including a pair of electrical connection layers 23 and the insulating protection layers 22 of their both sides, is received in the holding receiving opening 14 in such a state that the layers 23 and 22 are laminated in the width direction of the holder 12. A plurality of holding projections 14a are formed, as projections, on the inside surface of the holding receiving opening 14, then the electrical connection layers 23 and the insulating protection layers 22, made from elastomer and laminated, are surely received and held in the holding receiving opening 14 as pressed in the laminating direction by the holding projections 14a. The relatively concaved portions, on the both sides of the holding projections 14a on the inside surface of the holding receiving opening 14, function as grooves 14b for releasing expansion of the electrical connection layers 23 and the insulating protection layers 22 pressed by the holding projections 14a.

Each of the fastening member insertion hole 13 is a penetration hole penetrating the holder 12 in its thickness direction, and the bolt 71 as a fastening member is inserted therein. The plan view arrangement of the fastening member insertion holes 13 is the same on all of the holders 12 and the same as the arrangement of the fastening member insertion holes 52 on the module boards 51.

In the present embodiment, the holder 12 includes first board engagement projections 15 and second board engagement projections 16 as board engagement portions, and couplers 17 as holder coupling portions.

Each of the first board engagement projections 15 includes a stick-like engagement rod 15a, extending downward from either longitudinal end of the bolder 12, and an engagement hook 15b, formed at bottom end of the engagement rod 15a and projecting toward the longitudinal center of the holder 12. Each of the second board engagement projections 16 includes a stick-like engagement rod 16a, extending downward from rear side edge of the holder 12, and an engagement hook 16b, formed at bottom end of the engagement rod 16a and projecting toward front of the holder 12. When the connector 11 is mounted on the up-side surface of the module board 51 as shown in FIG. 5, the engagement hook 15b of the first board engagement projection 15 and the engagement hook 16b of the second board engagement projection 16 engage with the down-side surface of the module board 51. The engagement rod 15a of the first board engagement projection 15 is received in each of the engagement recesses 54 formed on edges of both sides of the module board 51, and the engagement rod 16a of the second board engagement projection 16 abuts against rear side edge of the module board 51, Thereby, the connector 11 is engaged with and mounted on the module board 51 as properly positioned.

Each of the couplers 17 includes a pair of legs 17a disposed in front and behind and opposing each other. The pair of legs 17a, each of which has a generally crank-like side shape, are disposed in such a way that the gap between each other is wide in their upper portions and narrow in their lower portions. The wide gap in their upper portions functions as a receiving portion 17d, and the pairs of legs 17a in their lower portions function as an insert portion 17b, which is received in the receiving portion 17d. An engagement recess 17e is formed on each of confronting inside surfaces of the legs 17a in the receiving portion 17d, and an engagement hook 17c is formed on each of opposite outside surfaces of the legs 17a at their bottom ends, so that the engagement hooks 17c project in the opposite direction each other. When the module boards 51 provided with the connectors 11 are laminated in a vertical direction as shown in FIGS. 8 and 9, the insert portions 17h of the couplers 17 of the connector 11 on the upside are inserted in the receiving portions 17d of the couplers 17 of the connector 11 on the downside, and the engagement hooks 17c of the couplers 17 of the connector 11 on the upside enter in and engage with the engagement recesses 17e of the couplers 17 of the connector 11 on the downside. Thereby, the vertically adjacent connectors 11 are engaged with and coupled with each other by the couplers 17.

Thus, when the vertically adjacent connectors 11 are coupled with each other by the couplers 17 and the module boards 51 provided with the connectors 11 are laminated in the up-down direction, the plan view arrangements of the electric conductor members 24 in fill the holders 12 become generally identical, so that the plan view arrangements of the electrodes 53 in all the module boards 51 become generally identical and corresponding to those of the electric conductor members 24, and that the plan view arrangements of the hastening member insertion holes 13 in all the laminated connectors 11 and those of the fastening member insertion holes 52 of all the module boards 51 become generally identical.

The bolts 71, as fastening members, are inserted in all the fastening member insertion holes 13 of the connectors 11 and in all the fastening member insertion holes 52 of the module boards 51, and screwed and fastened into the screw holes 72a formed in the nut plate 72. Thereby, the top and bottom ends of each of the electric conductor members 24 of the connector 11 are pressed by the corresponding electrodes 53 of the module board 51, so the electric conductor members 24 and the electrodes 53 are electrically connected for sure, then the corresponding electrodes 53 of the adjacent module boards 51 are electrically connected each other for sure.

One or more module boards 51 can be further arranged to piled above the module board 51 at the top or beneath the module board 51 at the bottom, if needed.

As described above, the electric device 10 according to the present embodiment comprises a plurality of module boards 51 piled up on one another and the connector 11 connecting the module boards 51. And each of the module boards 51 is provided with the electrode 53 on its surface, the electrodes 53 on the piled-up module boards 51 are generally positioned along a vertical straight line, the connector 11 includes the body portion 21 electrically connecting the electrodes 53 positioned along the vertical straight line, and the holder 12 holding the body portion 21, the holder 12 includes the first board engagement projections 15, the second board engagement projections 16 and the couplers 17, the first board engagement projections 15 and the second board engagement projections 16 engage with the module board 51 so that the connector 11 is mounted on the module board 51, and the coupler 17 engages with another coupler 17 so that the connector 11 is coupled to another vertically adjacent connector 11.

Thereby, it is possible to obtain the electric device 10, which is easy to manufacture, extensible and of high quality. The connector 11 can be mounted on the module board 51 through such an easy operation as engaging the first board engagement projection 15 and the second board engagement projection 16 with the module board 51, and the vertically adjacent connectors 11 can be coupled with each another through such an easy operation as engaging the couplers 17 with each another, so assembly work of the electric device 10 can be easily done even with an increased number of connectors 11 and module boards 51 and the productivity of the electric device 10 is improved.

Further, the body portion 21 includes the electrical connection layer 23 that is made from elastomer and includes a plurality of vertically extending electric conductor members 24 arranged in parallel, the holder 12 includes the holding receiving opening 14 that receives the body portion 21, the holding projection 14a formed on the inside surface of the holding receiving opening 14 for pressing the body portion 21, and grooves 14b formed on the inside surface of the holding receiving opening 14 for releasing expansion, and top and bottom ends of the electric conductor members 24 contact the electrodes 53. Therefore, the quality of the electric device 10 improves, since it is possible to control the expansion and contraction of the elastic body portion 21 and to control the increase in resistance of the electric conduction member 24.

Next will be described a second embodiment. Structural features similar to those of the first embodiment are denoted by common reference numerals, and repeated description thereof will be omitted. Moreover, repeated description of operation and effects similar to those of the first embodiment will be omitted.

Figure 10:
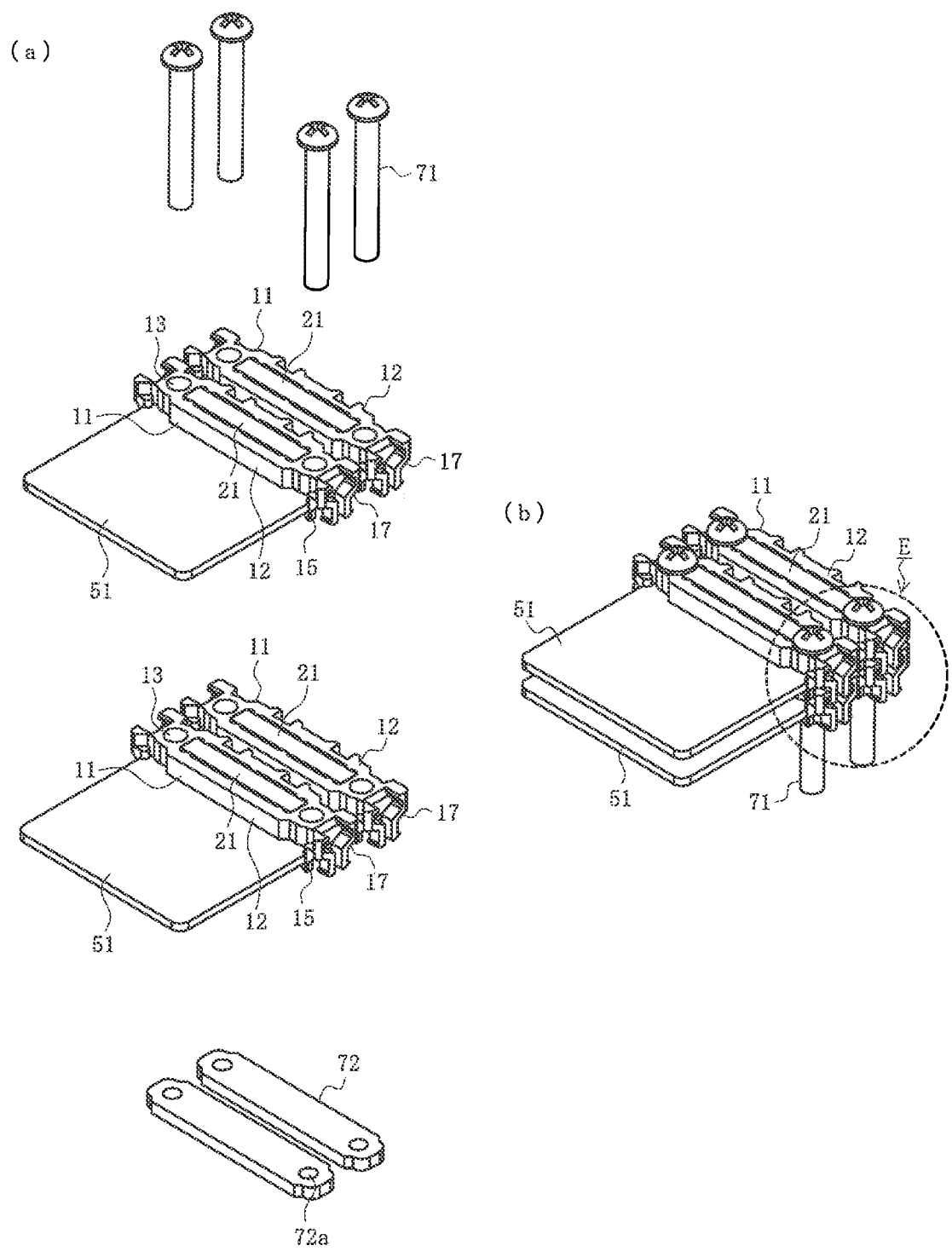
FIG. 10 is a view showing an electric device according to a second embodiment.
Figure 11:
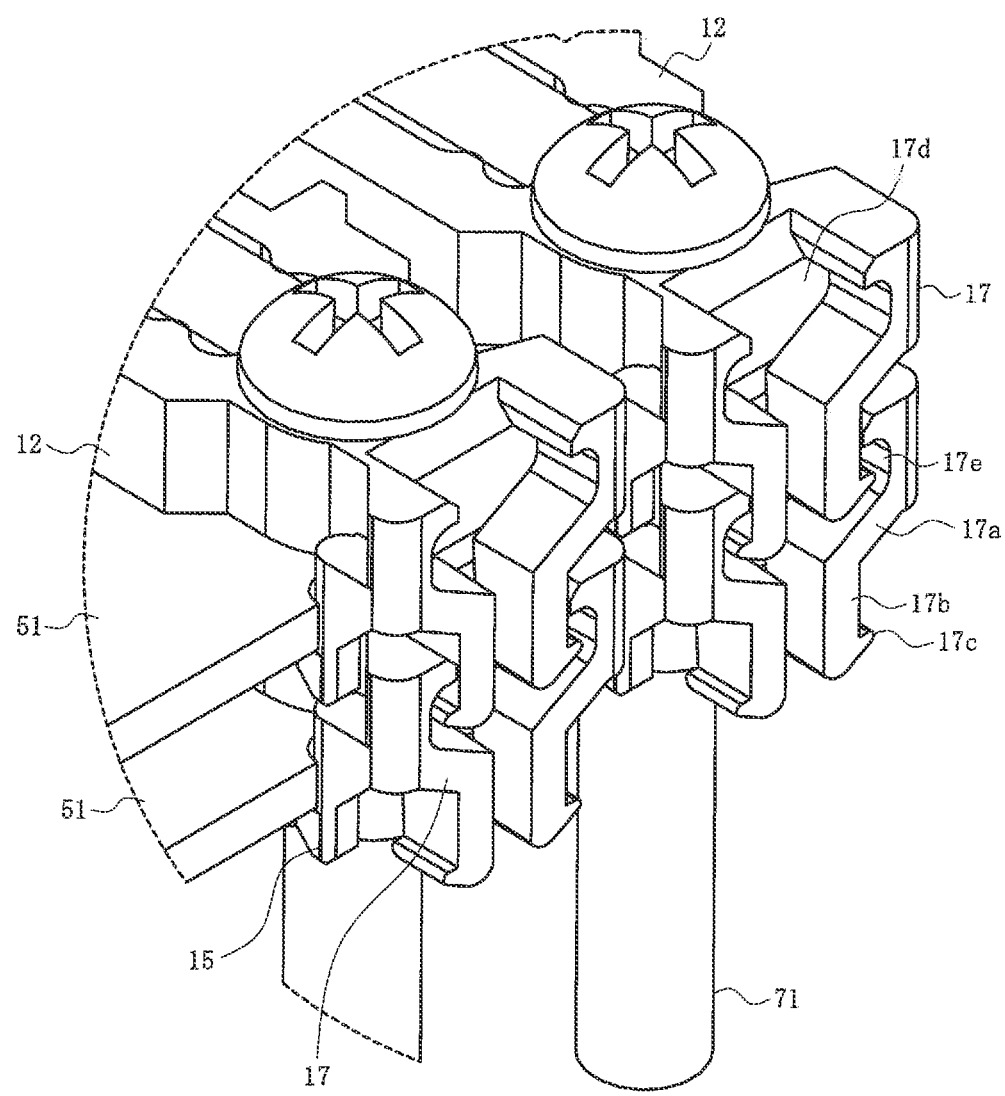
FIG. 11 is an enlarged view of a main portion ("E" portion in FIG. 10(*b*)) of the electric device according to the second embodiment.

FIG. 10 is a view showing an electric device according to a second embodiment; FIG. 11 is an enlarged view of a main portion ("E" portion in FIG. 10(b)) of the electric device according to the second embodiment. In FIG. 10, (a) is a partial exploded view and (b) is a perspective view.

While an example of the electrodes 53 arranged in two rows along the rear side edge of the module board 51 was described in the first embodiment, here will be described in the second embodiment another example of the electrodes 53 arranged in two more rows in front (lower left in FIG. 10) of their two rows along the rear side edge of the module board 51.

It is necessary to arrange many electrodes 53 in case of acquiring data; such as vibration or images, for which high speed processors are needed, since such processors have many terminals. Then, it is necessary to arrange the electrodes 53 in two more rows or in four rows totally, as the example shown in FIG. 10, since it is impossible to arrange many enough electrodes 53 in two rows.

Corresponding to this, the two connectors 11 are arranged side by side in the present embodiment. That is, in addition to the connector 11 described in the first embodiment, another same connector 11 is mounted on the module board 51 in front of the former connector 11. The connector 11 mounted in front has the same structure as the connecter 11 mounted behind, excepting that the second board engagement projections 16 are omitted.

Other structures and operations are similar to those of the first embodiment, therefore description thereof is omitted.

As described above, a plurality of connectors 11 are mounted on one module board 51 and each of the connectors 11 is coupled to each of the connectors 11 mounted on another vertically adjacent module boards 51, awarding to the present embodiment. Therefore, it is possible to cope with the increase of rows of the electrodes 53, when high speed processors are needed and many electrodes 53 are needed for them. That is, there is no limit to the number of the electrodes 53 and any kind of the module board 51 is available, so that the extendibility of the electric device 10 is enhanced.

Next will be described a third embodiment. Structural features similar to those of the first and second embodiments are denoted by common reference numerals, and repeated description thereof will be omitted. Moreover, repeated description of operation and effects similar to those of the first and second embodiments will be omitted.

Figure 12:
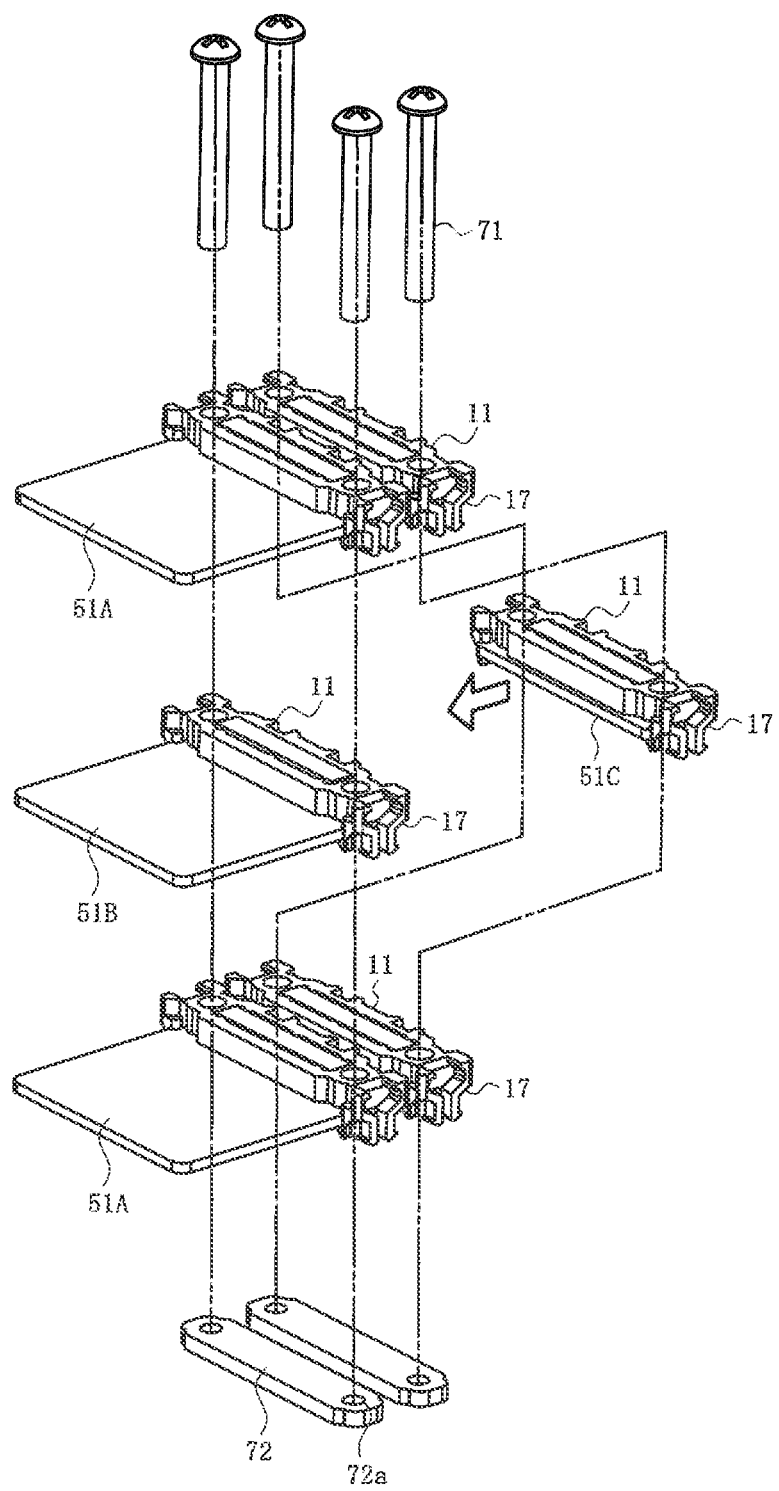
FIG. 12 is a partial exploded view of an electric device according to a third embodiment.
Figure 13:
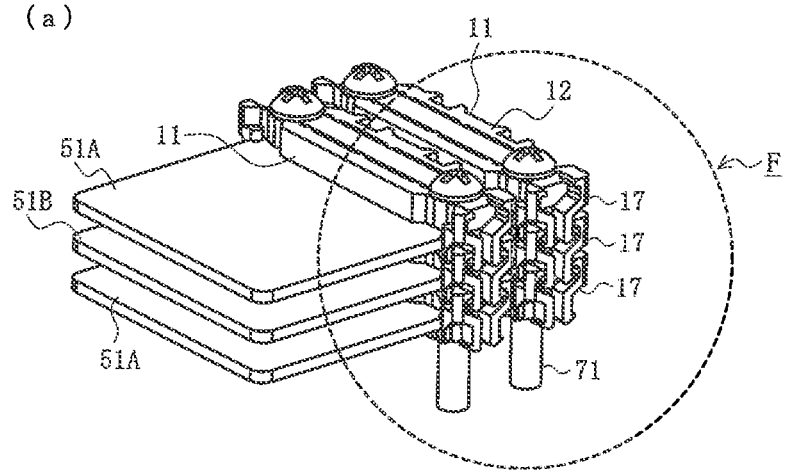
FIG. 13 is a perspective view of the electric device according to the third embodiment.
Figure 13:
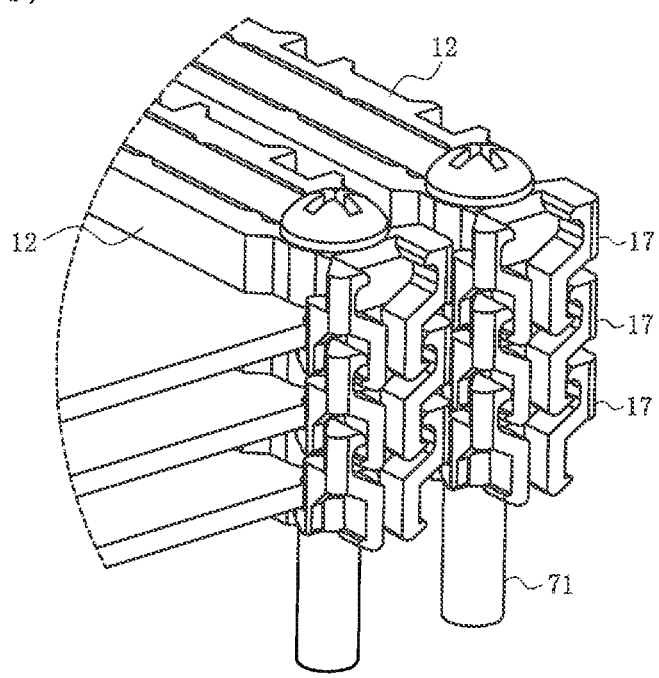

FIG. 12 is a partial exploded view of an electric device according to a third embodiment; and FIG. 13 is a perspective view of the electric device according to the third embodiment. In FIG. 13, (a) is a whole view and (b) is an enlarged view of "F" portion of (a).

While an example of the electrodes 53 arranged in two rows along the rear aide edge of the module board 51 was described in the first embodiment and an example of the electrodes 53 arranged in four rows along the rear aide edge of the module board 51 was described in the second embodiment, here will be described in the third embodiment an electric device 10 having a pile of the module board 51 with the electrodes 53 arranged in two rows and the module board 51 with the electrodes 53 arranged in four rows.

In case of acquiring a sort of data, such as temperature or humidity, for which low speed processors are available, and another sort of data, such as vibration or images, for which high speed processors are needed, by one electric device 10, this electric device 10 should have a pile of the module board 51 with the electrodes 53 arranged in two rows and the module board 51 with the electrodes 53 arranged in four rows. Here the module board 51 with the electrodes 53 arranged in four rows will be described as a first module board 51A, and the module board 51 with the electrodes 53 arranged in two rows will be described as a second module board 51B.

According to an example illustrated in Figs., the first module boards 51A are disposed above and beneath the second module board 51B. While each of the first module boards 51A has the electrodes 53 arranged in four rows and, accordingly, two connectors 11 arranged on its upper surface, the second module 51B has the electrodes 53 arranged in just tow rows and, accordingly, just one connector 11 arranged on its upper surface. So, if things go like this, it may be impossible for the electrodes 53 in two rows of the first module board 51A to conduct to the electrodes 53 of other module boards 51.

Then, a dummy board 51C is used in the present embodiment. Although any circuit of electric conductor lines is not formed in the dummy board 51C, nor is any module acquiring data mounted on it, a plurality of electrodes 53 are formed and exposed in two rows on both surfaces of it, and the corresponding electrodes 53 on both surfaces are electrically connected with each other. Here, the arrangement of the electrode 53 on the dummy board 51C is the same as that of the electrode 53 in the behind two rows on the second module board 51B. The same connector 11 as one described in the first embodiment is mounted on the upper surface of the dummy board 51C.

As shown in Figs., the dummy board 51C with the connector 11 mounted thereon is disposed in the same vertical position as the second module board 51B and in the back of it, and the first module boards 51A are disposed above and beneath the second module board 51B and the dummy board 51C.

Other structures and operations are similar to those of the first and second embodiments, therefore description thereof will be omitted.

As described above, the first module board 51A mounting a plurality of connectors 11 lies above or beneath the second module board 51B mounting a singularity of the connector 11 so that the singular connector 11 is coupled to one of the plural connectors 11 on the first module board 51A, according to the present embodiment. Also, the electric device 10 further comprises the dummy board 51C mounting the connector 11, and the dummy board 51C is disposed at the same vertical position as the second module board 51B mounting the singular connector 11 and the connector 11 mounted on the dummy board 51C is coupled to the remaining connector 11 of the plural connectors 11 on the first module 51A.

Therefore, it is possible to use one module board 51 with few electrodes 53 and another module board 51 with many electrodes 53 in combination and to use plural kinds of the module boards 51 together, so that the extendibility of the electric device 10 is enhanced.

Next will be described a fourth embodiment Structural features similar to those of the first through third embodiments are denoted by common reference numerals, and repeated description thereof will be omitted. Moreover, repeated description of operation and effects similar to those of the first through third embodiments will be omitted.

Figure 14:
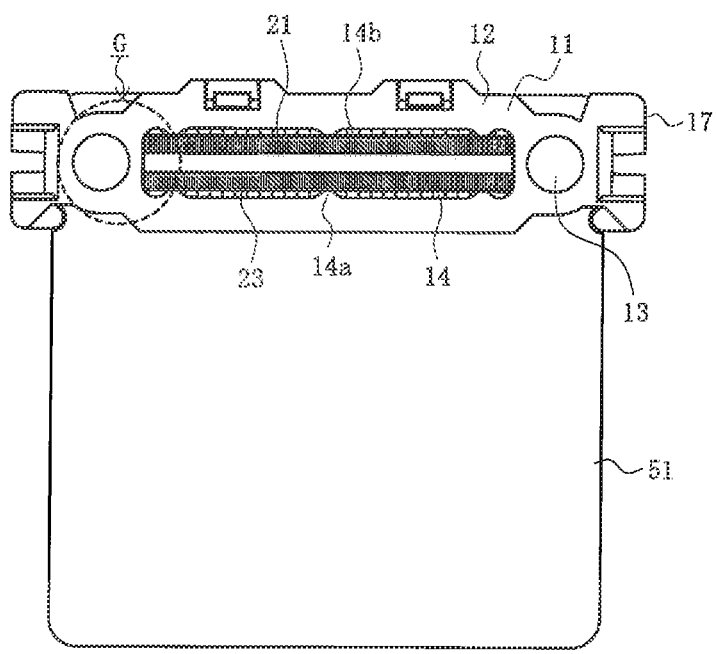
FIG. 14 is a top view showing a combination of a module board and a connector of an electric device according to a fourth embodiment.
Figure 14:
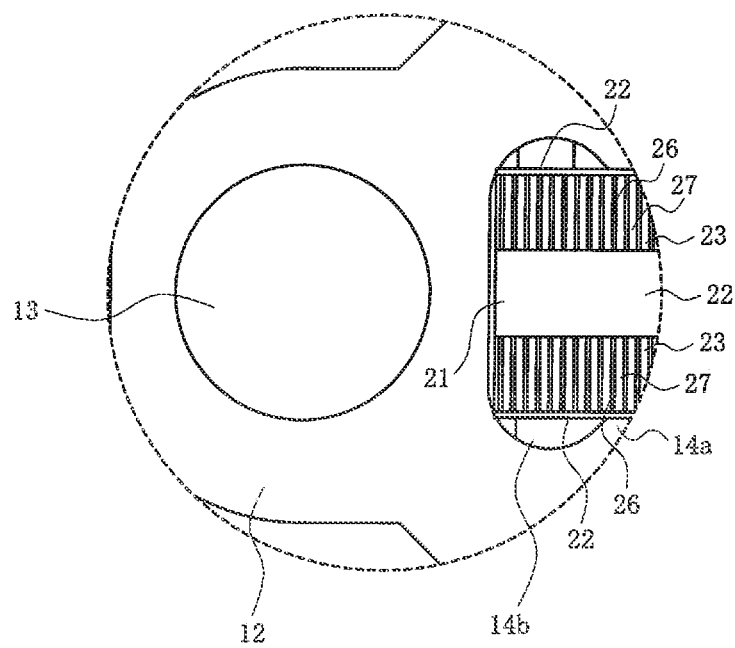
Figure 15:
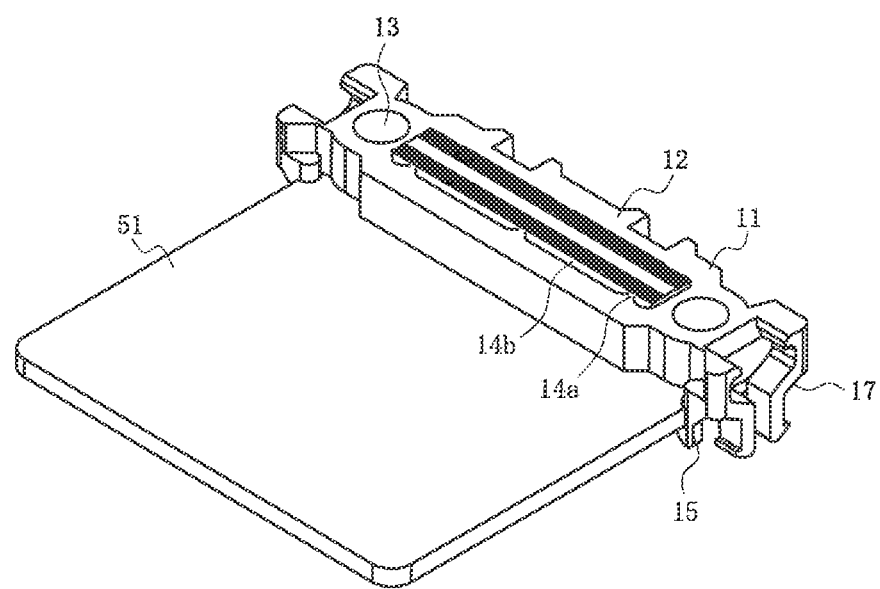
FIG. 15 is a perspective view showing the combination of the module board and the connector of the electric device according to the fourth embodiment.

FIG. 14 is a top plan view slowing a combination of a module board and a connector of an electric device according to a fourth embodiment and FIG. 15 is a perspective view showing the combination of the module board and the connector of the electric device according to the fourth embodiment. In FIG. 14, (a) is a general view and (b) is an enlarged view of "G" portion of (a).

While the first embodiment described an example of the electrical connection layer 23 in the body portion 21 of the connector 11 comprising the insulator 25 and the round bar shaped electric metal conductor members 24 embedded in the insulator 25, here will be described in the fourth embodiment another example of the electrical connection layer 23 in the body portion. 21 of the connector 11 made of alternately laminated plate-like insulators 27 and plate-like conductor members 26, wherein each insulator 27 is made from elastic elastomer, such as silicone sponge rubber, and each conductor member 26 is made from conductive elastomer.

The electric conductor member 26, in the present embodiment, is a plate-like member made from conductive elastomer, such as conductive rubber, produced by mixing powders of silver-like conductive metal, carbon-like conductive particles, or whiskers into insulative elastomer. A plurality of the electric conductor members 26 are arranged in parallel leaving the predetermined space between each other, and each of the plate-like insulators 27 is disposed in the space and stuck on the electric conductor members 26 on its both sides with adhesives.

Other structures and operations are the same as those of the first through third embodiments, therefore description thereof will be omitted.

According to the present embodiment, the electric conductor member 26 is made from conductive elastomer, so that it has pliability in the thickness direction of the holder 12, i.e., the laminating direction of the module board 51. Therefore, even if the distance between the electrodes 53 of the adjacent module boards 51 changes due to variations in planarity of the module board 51, in listening force of the bolt 71 and the nut plate 72, etc., the electric conduction member 26 can maintain contact with the electrode 53 certainly, and conductive state between the corresponding electrodes 53 on each module board 51 is maintained certainly.

Next will be described a fifth embodiment. Structural features similar to those of the first through fourth embodiments are denoted by common reference numerals, and repeated description thereof will be omitted. Moreover, repeated description of operation and effects similar to those of the first through fourth embodiments will be omitted.

Figure 16:
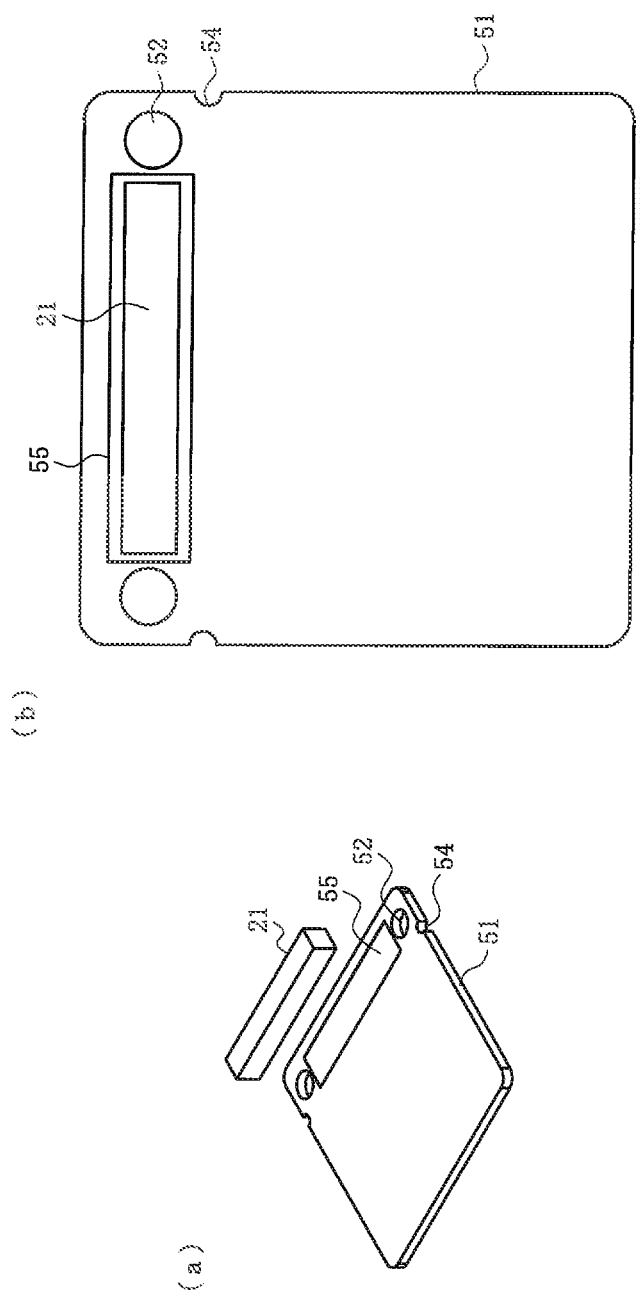
FIG. 16 is a view showing a positional relation between a resist opening of a module board and a body portion of a connector of an electric device according to a fifth embodiment.
Figure 17:
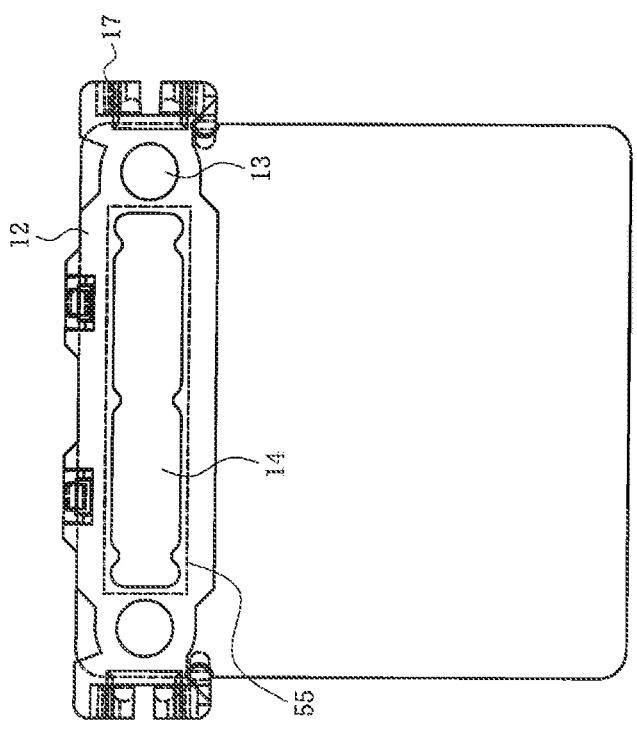
FIG. 17 is a view showing the positional relation between the resist opening of the module board and a holder of the connector of the electric device according to the fifth embodiment.
Figure 17:
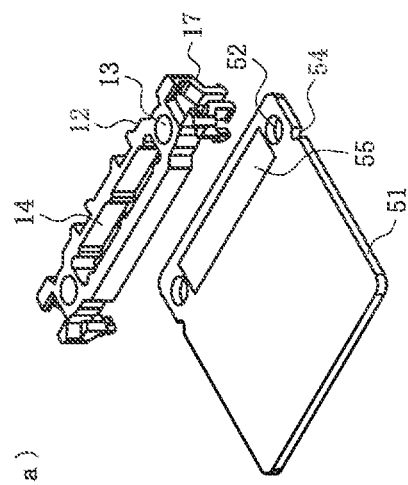

FIG. 16 is a view showing a positional relation between a resist opening of a module board and a body portion of a connector of an electric device according to a fifth embodiment; and FIG. 17 is a view showing the positional relation between the resist opening of the module board and a holder of the connector of the electric device according to the fifth embodiment. In FIGS. 16 and 17, (a) is a perspective view and (b) is a top view.

Here, in the present embodiment, will be described a resist opening 55 formed in the circumference of the electrodes 53 on the surfaces of both side of the module board 51.

Although the surfaces of the up and down sides of the module board 51 are covered with resist as insulating film, the resist is removed from the surfaces of the electrodes 53 and connection pads for mounting terminals of the modules, etc. for electrical connection. In the present embodiment, as shown in Figs., the resist opening 55, as a portion from which resist is removed, is formed in a predetermined range corresponding to the whole rows of electrodes 53. The resist opening 55 is formed on the surface of the module board 51 as banger than the whole area that the body portion 21 of the connector 11 abuts thereon and the whole area that the holding receiving opening 14 of the holder 12 of the connector 11 abuts thereon. That is, the resist opening 55 is formed so that the whole abutting surface of the body portion 21 of the connector 11 and the whole abutting surface of the holding receiving opening 14 of the holder 12 of the connector 11 can be received in the area of the resist opening 55 on the surface of the module board 51.

Other structures and operations are the same as those of the first through fourth embodiments, therefore description thereof will be omitted.

As described above, the resist opening 55, from which resist is removed, is formed on the surface of the module board 51, and the resist opening 55 includes the whole surface of the body portion 21 abutting against the surface of the module board 51, according to the present embodiment. Therefore, the abutting surface of the body portion 21 against the surface of the module board 51 does not contact the surface of the resist, whose thickness is thicker than the electrode 53, so that the top and bottom ends of the electric conductor members 24 and 26 exposed on the abutting surface can contact the electrodes 53 certainly.

Next will be described a sixth embodiment. Structural features similar to those of the first through fifth embodiments are denoted by common reference numerals, and repeated description thereof will be omitted. Moreover, repeated description of operation and effects similar to those of the first through fifth embodiments will be omitted.

Figure 18:
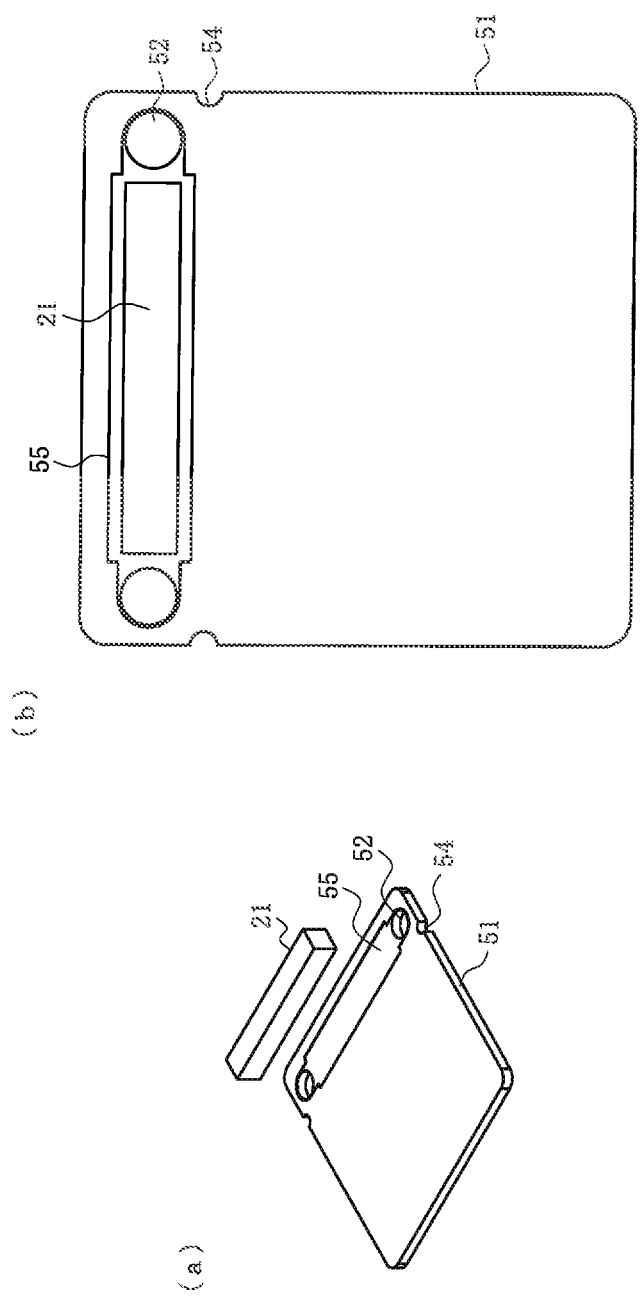
FIG. 18 is a view showing a positional relation between a resist opening of a module board and a body portion of a connector of an electric device according to a sixth embodiment.
Figure 19:
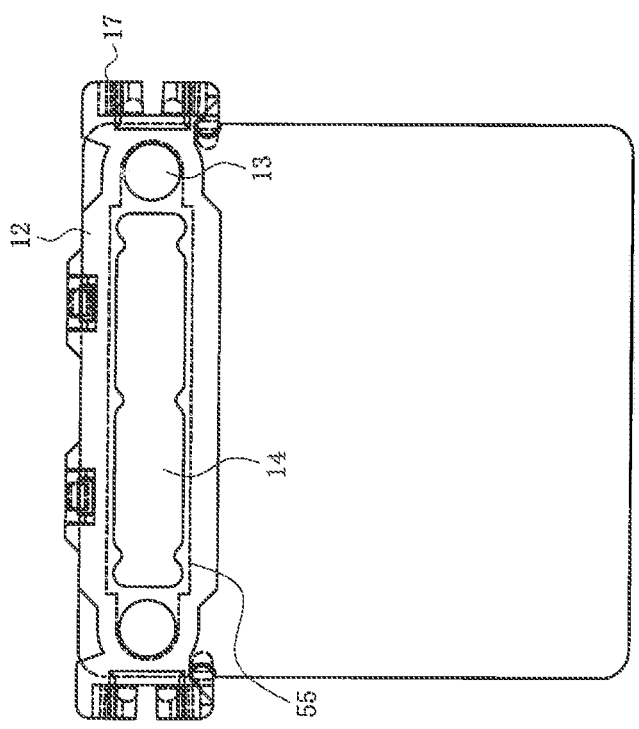
FIG. 19 is a view showing the positional relation between the resist opening of the module board and a holder of the connector of the electric device according to the sixth embodiment.
Figure 19:
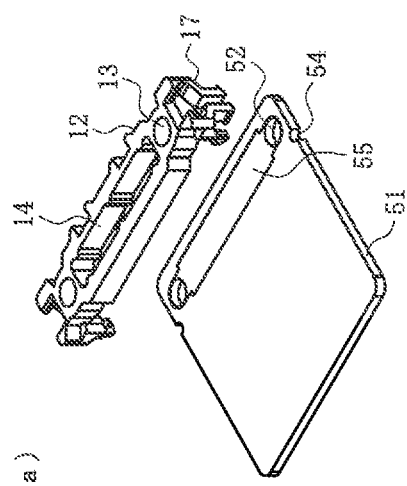

FIG. 18 is a view showing a positional relation between a resist opening of a module board and a body portion of a connector of an electric device according to a sixth embodiment; and FIG. 19 is a view showing the positional relation between the resist opening of the module board and a holder of the connector of the electric device according to the sixth embodiment. In FIGS. 18 and 19, (a) is a perspective view and (b) is a top view.

While the fifth embodiment described an example of the resist opening 55 formed so that the whole abutting surface of the body portion 21 of the connector 11 and the whole abutting surface of the holding receiving opening 14 of the holder 12 of the connector 11 can be received in the area of the resist opening 55 on the surface of the module board 51, here will be described, in the sixth embodiment, the resist opening 55 formed so that the whole abutting surface of the body portion 21 of the connector 11, the whole abutting surface of the holding receiving opening 14 of the holder 12 of the connector 11 and the whole fastening member insertion holes 52 formed in the module board 51 or the whole abutting surface of the fastening member insertion holes 13 of the folder 12 can be received in the area of the resist opening 55 on the surface of the module board 51.

Other structures and operations are the same as those of the fifth embodiment, therefore description thereof will be omitted.

The disclosure in the present Description describes characteristics regarding to the preferable and exemplary embodiments. Various other embodiments, modification and variations in the scope and the gist of the Claim(S) attached hereto would be reached by a person skilled in the art by referring to the disclosure in the present Description.

INDUSTRIAL APPLICABILITY

The present disclosure is applicable to an electrical device.

REFERENCE SIGNS LIST 10 electric device
11 connector
12 holder
14 holding receiving opening
14a holding projection
14b groove
15 first board engagement projection
16 second board engagement projection
17 coupler
21 body portion
23 electrical connection layer
24, 26 electric conduction member
51 module board
51A first module board
51B second module board
51C dummy board
53 electrode
55 resist opening

The invention claimed is:
1. An electric device comprising:
  a plurality of module boards, the module boards piled up on one another, each of the module boards provided with an electrode on its surface, the electrodes on the piled-up module boards generally positioned along a vertical straight line; and
  a connector connecting the module boards, the connector including a body portion, the body portion electrically connecting the electrodes positioned along the vertical straight line, and a holder holding the body portion,
  the holder including a board engagement portion and a holder connecting portion,
  the board engagement portion engaging with the module board so that the connector is mounted on the module board, and the holder connecting portion engaging with another holder connecting portion so that the connector is coupled to another vertically adjacent connector.
2. The electric device according to claim 1, wherein a plurality of the connectors are mounted on one module board and each of the connectors is coupled to each of the connectors mounted on another vertically adjacent module board.

3. The electric device according to claim 1, wherein the module board mounting a plurality of the connectors lies above or beneath the module board mounting a singularity of the connector so that the singular connector is coupled to one of the plural connectors.

4. The electric device according to claim 3, wherein the electric device further comprises a dummy board mounting the connector, the dummy board is disposed at the same vertical position as the module board mounting the singular connector, and the connector mounted on the dummy board is coupled to the remaining connector of the plural connectors.

5. The electric device according to claim 4, wherein the body portion includes an electrical connection layer made from elastomer, the electrical connection layer includes a plurality of vertically extending electric conductor members arranged in parallel, the holder includes a holding receiving opening receiving the body portion, a projection formed on an inside surface of the holding receiving opening for pressing the body portion, and a groove formed on an inside surface of the holding receiving opening for releasing expansion, and top and bottom ends of the electric conductor members contact the electrodes.

6. The electric device according to claim 5, wherein a resist opening, from which resist is removed, is formed on the surface of the module board, and the resist opening includes a whole surface of the body portion abutting against the surface of the module board.

7. The electric device according to claim 4, wherein a resist opening, from which resist is removed, is formed on the surface of the module board, and the resist opening includes a whole surface of the body portion abutting against the surface of the module board.

8. The electric device according to claim 3, wherein the body portion includes an electrical connection layer made from elastomer, the electrical connection layer includes a plurality of vertically extending electric conductor members arranged in parallel, the holder includes a holding receiving opening receiving the body portion, a projection formed on an inside surface of the holding receiving opening for pressing the body portion, and a groove formed on an inside surface of the holding receiving opening for releasing expansion, and top and bottom ends of the electric conductor members contact the electrodes.

9. The electric device according to claim 3, wherein a resist opening, from which resist is removed, is formed on the surface of the module board, and the resist opening includes a whole surface of the body portion abutting against the surface of the module board.

10. The electric device according to claim 2, wherein the body portion includes an electrical connection layer made from elastomer, the electrical connection layer includes a plurality of vertically extending electric conductor members arranged in parallel, the holder includes a holding receiving opening receiving the body portion, a projection formed on an inside surface of the holding receiving opening for pressing the body portion, and a groove formed on an inside surface of the holding receiving opening for releasing expansion, and top and bottom ends of the electric conductor members contact the electrodes.

11. The electric device according to claim 2, wherein a resist opening, from which resist is removed, is formed on the surface of the module board, and the resist opening includes a whole surface of the body portion abutting against the surface of the module board.

12. The electric device according to claim 1, wherein the body portion includes an electrical connection layer made from elastomer, the electrical connection layer includes a plurality of vertically extending electric conductor members arranged in parallel, the holder includes a holding receiving opening receiving the body portion, a projection formed on an inside surface of the holding receiving opening for pressing the body portion, and a groove formed on an inside surface of the holding receiving opening for releasing expansion, and top and bottom ends of the electric conductor members contact the electrodes.

13. The electric device according to claim 1, wherein a resist opening, from which resist is removed, is formed on the surface of the module board, and the resist opening includes a whole surface of the body portion abutting against the surface of the module board.

* * * * *